(12) United States Patent
Hekmat

(10) Patent No.: US 11,809,019 B2
(45) Date of Patent: Nov. 7, 2023

(54) CONTACT LENS POWER SUPPLY WITH MOVABLE GENERATOR

(71) Applicant: Tectus Corporation, Saratoga, CA (US)

(72) Inventor: Mohammad Hekmat, Sunnyvale, CA (US)

(73) Assignee: Tectus Corporation, Saratoga, CA (US)

(*) Notice: Subject to any disclaimer, the term of this patent is extended or adjusted under 35 U.S.C. 154(b) by 388 days.

(21) Appl. No.: 17/145,176

(22) Filed: Jan. 8, 2021

(65) Prior Publication Data
US 2022/0221739 A1   Jul. 14, 2022

(51) Int. Cl.
| | | |
|---|---|---|
| *G02C 7/04* | (2006.01) | |
| *H02J 7/00* | (2006.01) | |
| *G02C 11/00* | (2006.01) | |
| *H02J 50/10* | (2016.01) | |

(52) U.S. Cl.
CPC ............. *G02C 11/10* (2013.01); *G02C 7/04* (2013.01); *G02C 7/049* (2013.01); *H02J 7/0024* (2013.01); *H02J 7/0063* (2013.01); *H02J 50/10* (2016.02); *H05K 2201/10121* (2013.01)

(58) Field of Classification Search
CPC . G02C 7/04; G02C 7/049; G02C 11/10; H02J 7/0024; H02J 7/0063; H02J 50/10; H05K 2201/10121
See application file for complete search history.

(56) References Cited

U.S. PATENT DOCUMENTS

| | | | |
|---|---|---|---|
| 2,835,829 A | 5/1958 | Sourgens | |
| 8,427,106 B2 | 4/2013 | Kim | |
| 8,957,610 B2 | 2/2015 | Lee | |
| 9,375,886 B2 * | 6/2016 | Pugh | B29D 11/00009 |
| 9,425,617 B2 | 8/2016 | Weidenheimer | |
| 10,288,909 B1 * | 5/2019 | Youssef | H04B 1/48 |
| 2005/0052154 A1 | 3/2005 | Kavounas | |
| 2009/0085553 A1 | 4/2009 | Kumar | |
| 2013/0194540 A1 * | 8/2013 | Pugh | B29D 11/00817 |
| | | | 623/6.11 |
| 2013/0258275 A1 * | 10/2013 | Toner | A61F 2/1627 |
| | | | 623/6.22 |

* cited by examiner

*Primary Examiner* — Levi Gannon
(74) *Attorney, Agent, or Firm* — Lewis Roca Rothgerber Christie LLP

(57) ABSTRACT

An electronic contact lens. In some embodiments, the electronic contact lens includes a plurality of power-consuming circuits and a power supply circuit. The power supply circuit may be configured to distribute available power among two voltage domains in the electronic contact lens according to changing power requirements within the two voltage domains.

15 Claims, 15 Drawing Sheets

$P_{DC}$ (μW)

|  | 0 V / 1 V | 3 V / 4 V | Total |
|---|---|---|---|
| Use Case I | 100 | 300 | 400 |
| Use Case II | 300 | 100 | 400 |
| Use Case III | 200 | 200 | 400 |

FIG. 2D

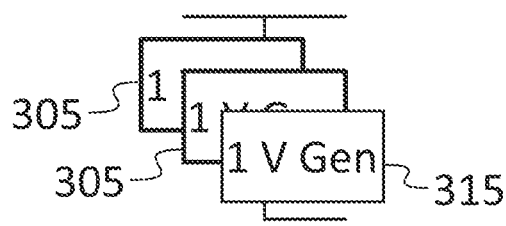
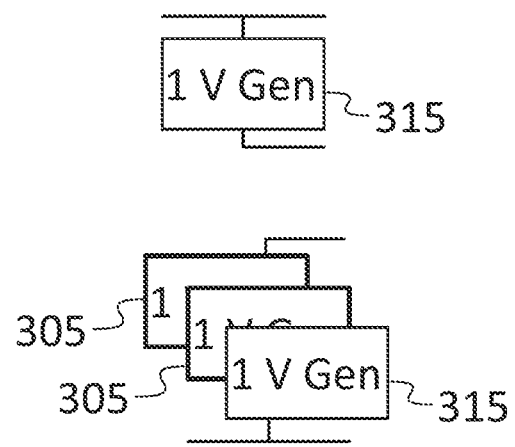
FIG. 3C
FIG. 3D
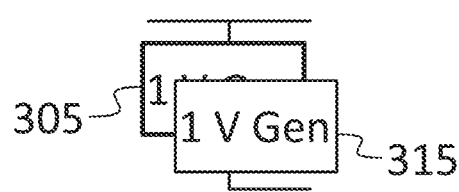
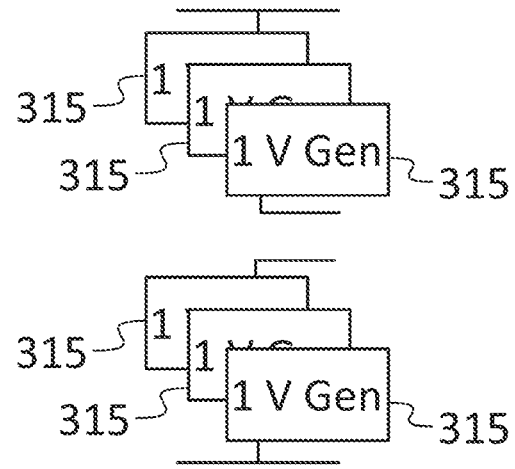
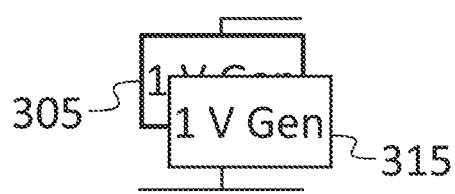
FIG. 3E
FIG. 3F

CONTACT LENS POWER SUPPLY WITH MOVABLE GENERATOR

FIELD

One or more aspects of embodiments according to the present disclosure relate to electronic contact lenses, and more particularly to power supply circuits for such contact lenses.

BACKGROUND

In an electronic contact lens, both integrated circuit chip area and power may be scarce. The contact lens may be capable of operating in different modes, with some features disabled, or operating at reduced performance, in some modes, reducing power consumption in those modes. The power requirements of power-consuming circuits in the electronic contact lens may therefore vary.

Thus, there is a need for a power supply circuit for supplying power according to varying requirements, in an electronic contact lens.

BRIEF DESCRIPTION OF THE DRAWINGS

These and other features and advantages of the present disclosure will be appreciated and understood with reference to the specification, claims, and appended drawings wherein:

FIG. 2D is a power consumption table, according to an embodiment of the present disclosure;

FIG. 3C is a block diagram of a DC to DC converter module, according to an embodiment of the present disclosure;

FIG. 3D is a block diagram of a DC to DC converter module, according to an embodiment of the present disclosure;

FIG. 3E is a block diagram of a DC to DC converter module, according to an embodiment of the present disclosure;

FIG. 3F is a block diagram of a DC to DC converter module, according to an embodiment of the present disclosure;

DETAILED DESCRIPTION

Figure 1A:
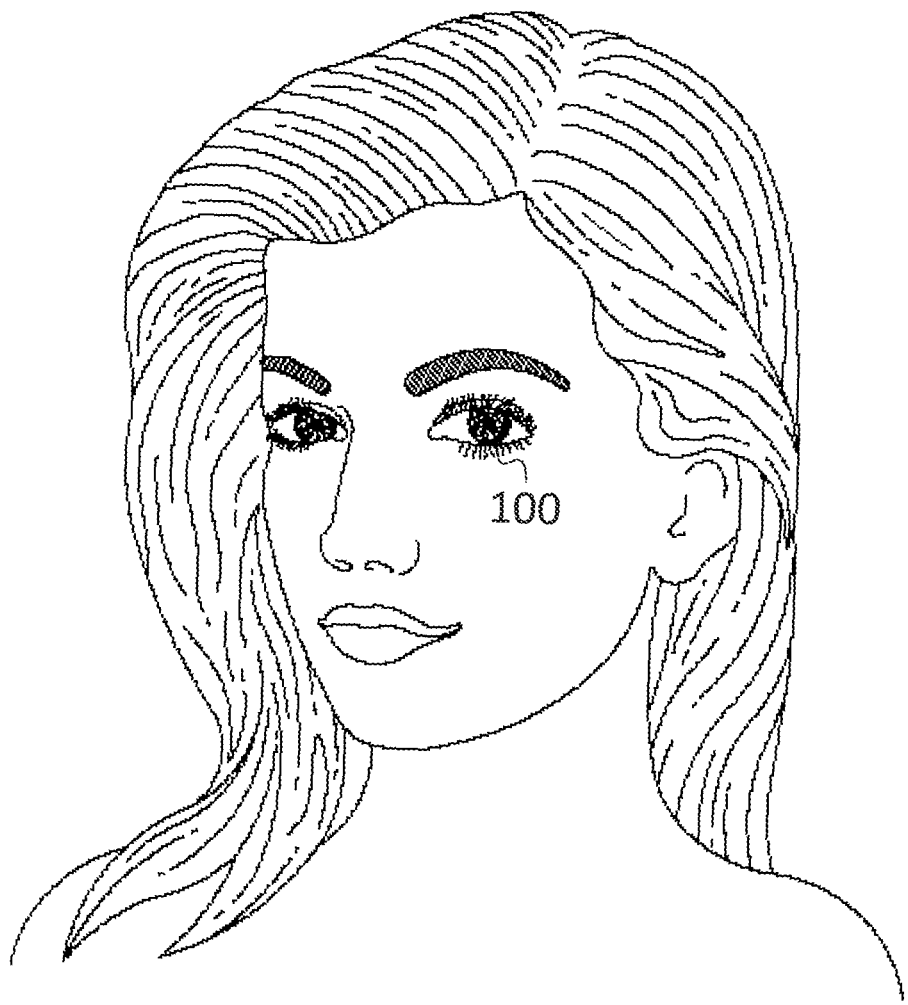
FIG. 1A is an illustration of a wearer wearing two electronic contact lenses, according to an embodiment of the present disclosure.

FIG. 1A shows a wearer wearing an electronic contact lens 100. The electronic contact lens 100 may include various electronic components, such as a display, a forward-looking imager, motion sensors (such as a gyroscope, an accelerometer, and a magnetometer, the combination of which may be referred to as an inertial measurement unit (IMU)), a radio (e.g., a 5-GHz radio transceiver), a lens controller, batteries, and a power supply circuit. The electronic contact lens 100 may have various functions; for example, (i) it may project images or text onto the wearer's retina, causing the wearer to see the projected images (e.g., augmented reality video) or text superimposed on the external scene the wearer is viewing (or only the projected images or text, if the wearer's eyes are closed), or (ii) it may assist a wearer with low vision using the forward-looking imager. The sensors in the electronic contact lens 100 (e.g., the IMU and the forward-looking imager) may be used to track the wearer's eye movements, so that the displayed images and text may appear, to the wearer, to be stationary, as the wearer's eyes move. In some circumstances, it may be advantageous for the wearer to wear two electronic contact lenses 100.

Figure 1B:
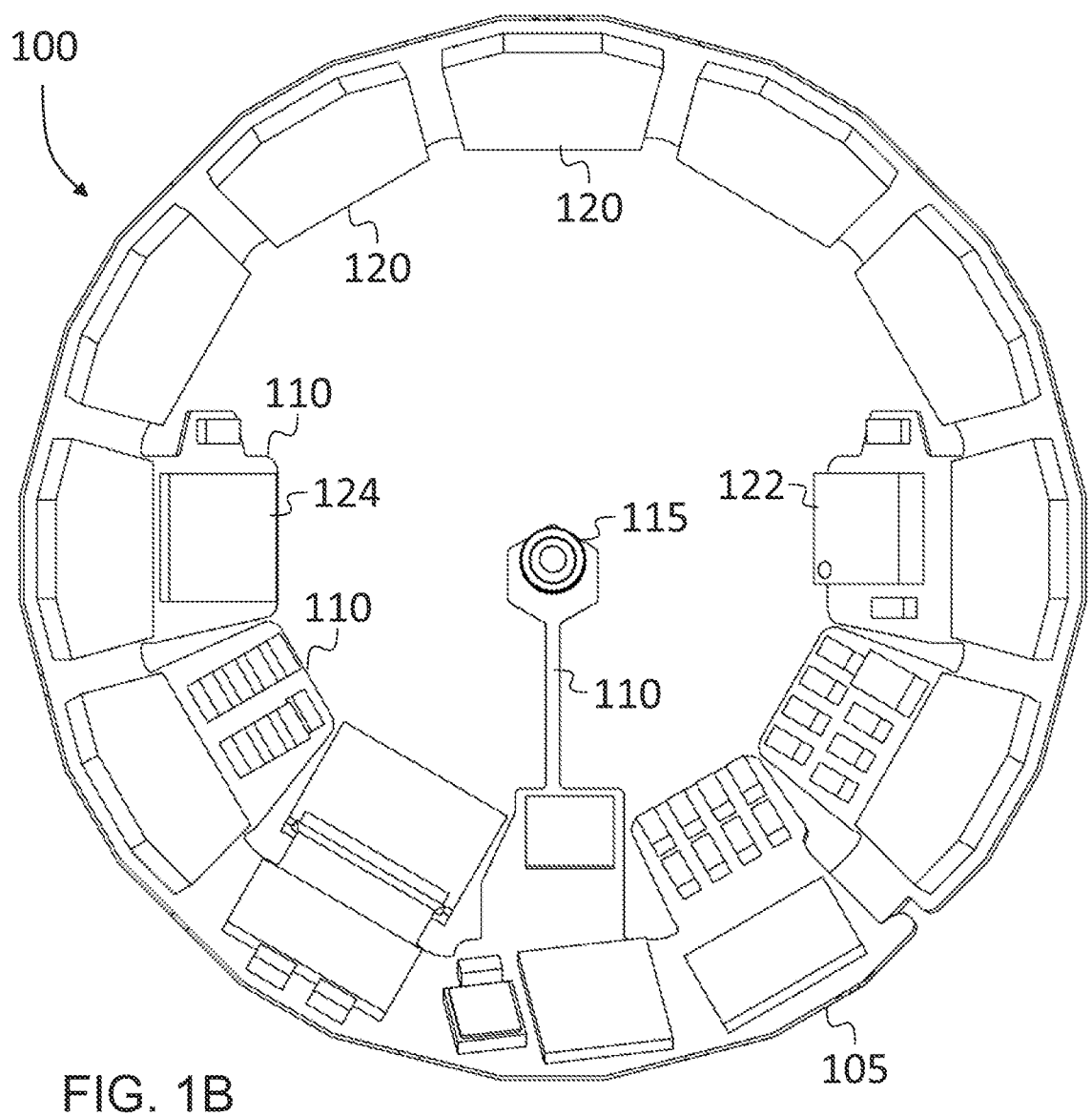
FIG. 1B is a posterior view of an electronic contact lens circuit, according to an embodiment of the present disclosure.

FIG. 1B shows a posterior view of a circuit for an electronic contact lens 100, in some embodiments. The circuit is fabricated as a flexible board 105, with a shape approximating a portion of a sphere, which may be included within the volume of a scleral contact lens. The circuit may be fabricated as an initially flat flexible board 105 (e.g., a plurality of components soldered to a flexible printed circuit) which may be coiled into the shape of a truncated cone with a plurality of extensions 110 for additional circuitry and for the display 115 (which may be a projector configured to project light onto the wearer's retina). Except for the display 115 and the extension 110 supporting it, the circuit may be entirely outside of the area of the wearer's pupil. As mentioned above, the electronic contact lens 100 may also include, for example, a plurality of batteries 120, a radio 122, a lens controller 124, an imager, an inertial sensor, and a power supply circuit. The electronic contact lens 100 may have relatively little space available for electronic parts, and it may therefore be advantageous to construct each such part to be as small as possible.

The electronic contact lens 100 may be capable of operating in several different modes, to perform different functions or to adapt to changing circumstances. For example, the transmitted power of the radio may be adjusted based on the signal to noise ratio of a signal received from the radio by another radio transceiver with which it communicates, or the radio, the display, and the circuitry between them may be capable of operating in a high data rate mode (e.g., to display streaming video to the wearer) or a low data rate mode (e.g., when only text is displayed to the wearer). In some modes, the motion sensors may be unused, and in some modes the display 115 may be unused. As such, the power consumption of some of the circuits may change when the electronic contact lens 100 transitions between different modes.

Figure 2A:
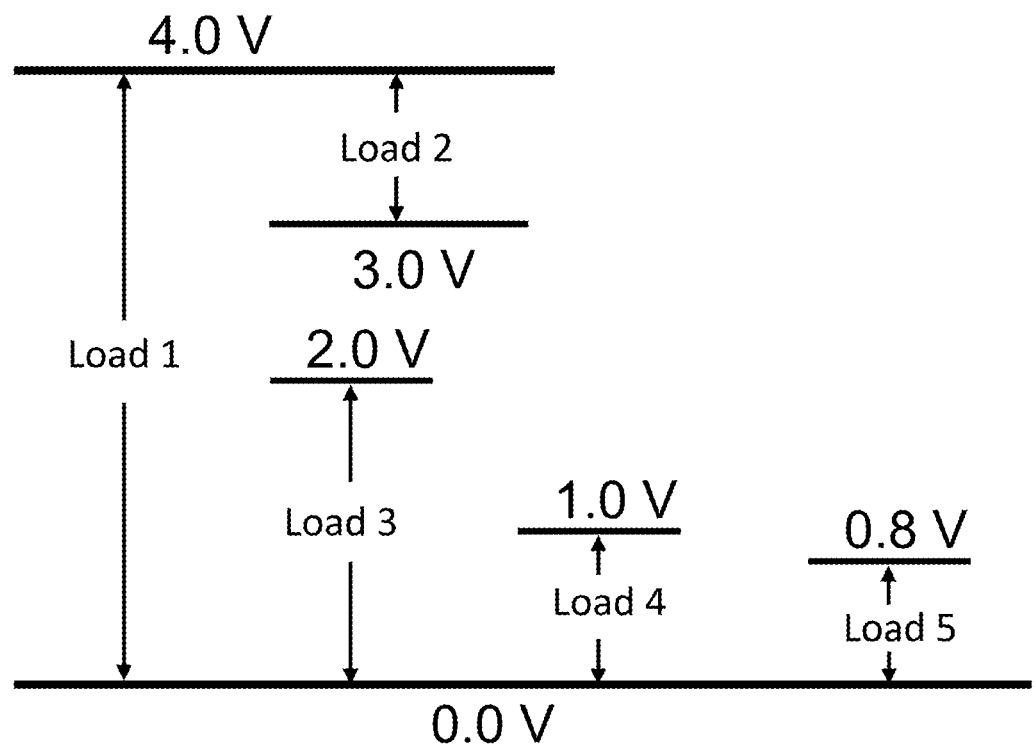
FIG. 2A is a power supply rail diagram, according to an embodiment of the present disclosure.

The power-consuming circuits of the electronic contact lens 100 may have different voltage requirements, illustrated for example in FIG. 2A. A first load (Load 1), for example, may draw power from a 4 V supply having a first rail at 0 V (ground) and a second rail at 4 V. As used herein, a "rail", or "power supply rail" is a conductor connected to an output of a voltage source. A second load (Load 2) may draw power from a first 1 V supply, the first 1 V supply having a common positive rail with the 4 V supply, so that the negative rail of the first 1 V supply is at a voltage of 3 V relative to the ground of the 4 V supply. A third load (Load 3) may draw power from a 2 V supply having a common ground with the 4 V supply, a fourth load (Load 4) may draw power from a second 1 V supply having a common ground with the 4 V supply, and a fifth load (Load 5) may draw power from a 0.8 V supply, having a common ground with the 4 V supply. The loads may include, for example, circuits of the display, the forward-looking imager, the motion sensors, and the radio.

Figure 2B:
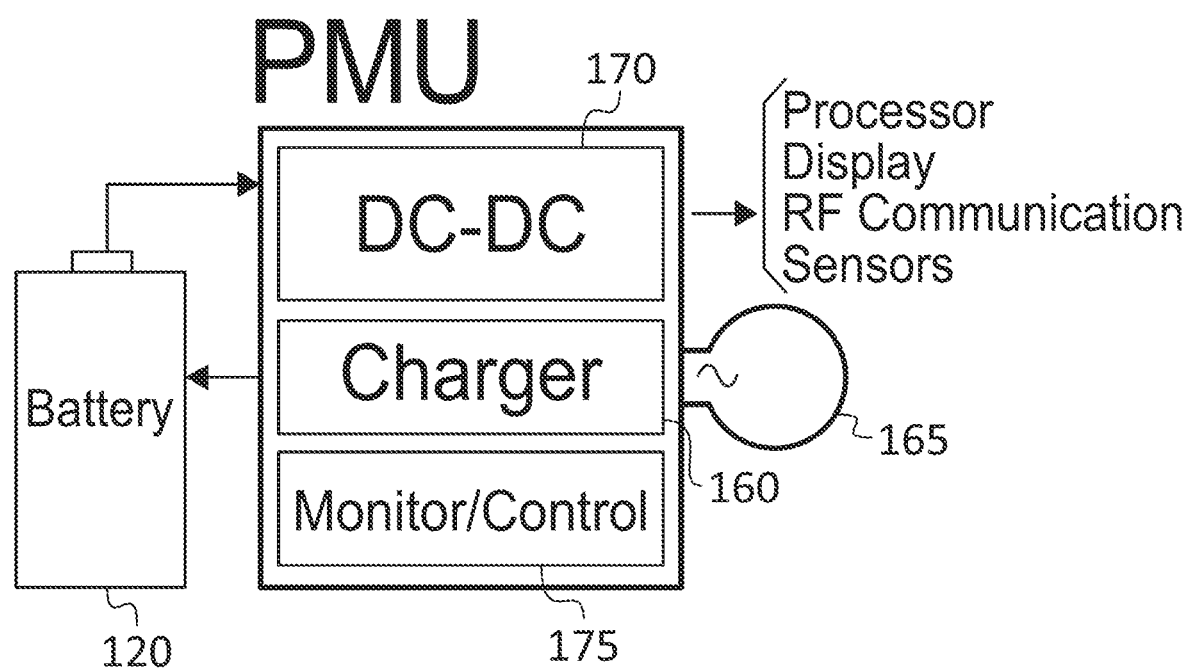
FIG. 2B is a block diagram of a power system for an electronic contact lens, according to an embodiment of the present disclosure.

Referring to FIG. 2B, power may be supplied to the power-consuming circuits by a power management unit (PMU) 155, illustrated in FIG. 2B. The power management unit may include one or more batteries 120, a charger 160 (which may receive inductively-coupled power from an external power source through a loop 165), a DC to DC converter module 170, and a monitoring and control circuit 175. When the electronic contact lens 100 is worn, its electronic elements may be powered by the battery, which may periodically be recharged, e.g., by removing the electronic contact lens 100 from the eye and placing it in a charging station which provides inductively-coupled power to the power management unit 155. In some embodiments, the power management unit 155 instead, or also, receives inductively coupled power while the electronic contact lens 100 is being worn (with, e.g., the inductive source coil being (i) worn around the wearer's neck or (ii) in glasses worn by the wearer). In some embodiments, power (e.g., for charging) is coupled into the electronic contact lens 100 by capacitive or optical coupling.

Figure 2C:
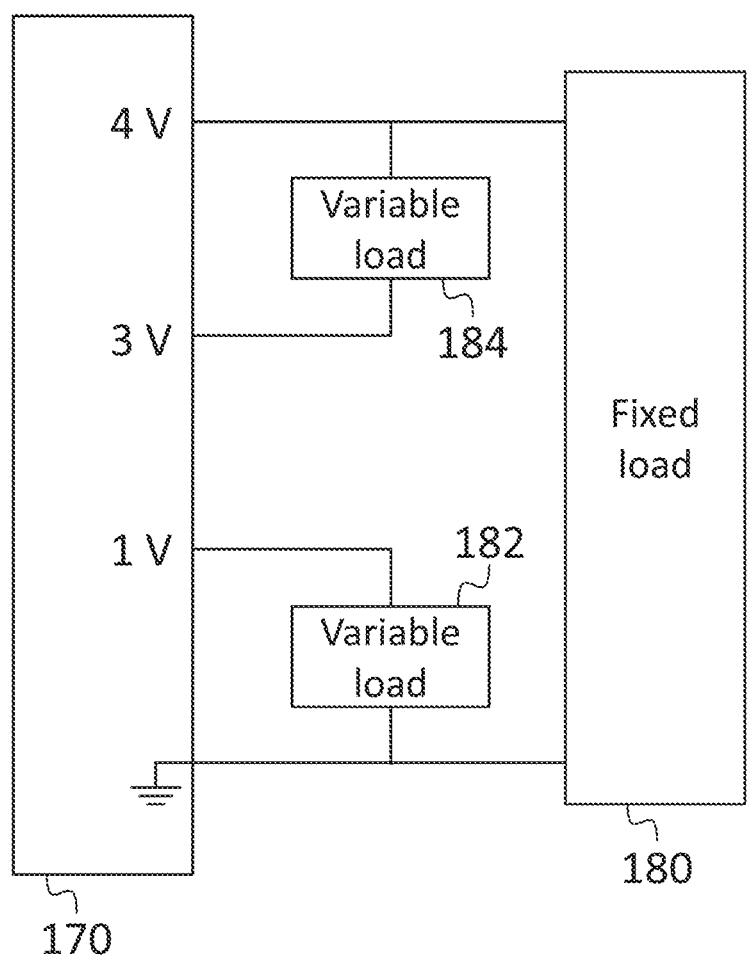
FIG. 2C is a block diagram of a power supply and several power-consuming circuits, according to an embodiment of the present disclosure.

FIG. 2C shows, in a simplified example, the DC to DC converter module 170 connected to three power-consuming circuits, including a fixed-current power-consuming circuit (or "fixed load") 180 (which may be, or include, the array of LEDs, and which draws substantially constant current at a voltage of 4 V), and two variable-current power-consuming circuits 182, 184. A first variable-current power-consuming circuit (or "variable load") 182 is connected between ground and the 1 V rail, and a second variable-current power-consuming circuit 184 (which may be, e.g., the analog circuit in the display) is connected between the 3 V rail and the 4 V rail. Each of the power-consuming circuits may be considered to be within a "voltage domain", each voltage domain being the set of circuits connected to a pair of power supply rails. In some embodiments, the DC to DC converter module 170 is entirely in one integrated circuit, e.g., it is fabricated on a single silicon (e.g., complementary metal oxide semiconductor (CMOS)) chip. The DC to DC converter module 170 may include a plurality of voltage generators. As used herein, a "voltage generator" (or a "voltage generator circuit") is a power supply element having two or more output terminals, or "outputs" for delivering power to power-consuming circuits such as one or more integrated circuits. A voltage generator may include one or more voltage generators, e.g., a voltage generator may be a "composite voltage generator" (or "composite voltage generator circuit") including a plurality of voltage generator circuits. As such, the DC to DC converter module 170 may itself be a voltage generator.

Each of the two variable-current power-consuming circuits 182, 184 may draw a current (or a corresponding amount of power) that depends on the operating mode of the electronic contact lens 100. For example, as illustrated in FIG. 2D, in a first mode (which may be referred to as "Use Case I"), the first variable-current power-consuming circuit 182 may draw 100 μW (microwatts) (e.g., 100 pA (microamperes) at 1 V) and the second variable-current power-consuming circuit 184 may draw 300 μW; in a second mode (which may be referred to as "Use Case II"), the first variable-current power-consuming circuit 182 may draw 300 μW and the second variable-current power-consuming circuit 184 may draw 100 μW; and in a third mode (which may be referred to as "Use Case III"), the first variable-current power-consuming circuit 182 and the second variable-current power-consuming circuit 184 may each draw 200 μW.

To accommodate these varying power requirements, the DC to DC converter module 170 may be constructed to include (i) a first voltage generator capable of supplying 300 μW between 0 V and 1 V, and (ii) a second voltage generator capable of supplying 300 μW between 3 V and 4 V. In such an embodiment, part of the capacity of the first voltage generator, or part of the capacity of the second voltage generator, or both, may be unused in each of the three modes.

Figure 3A:
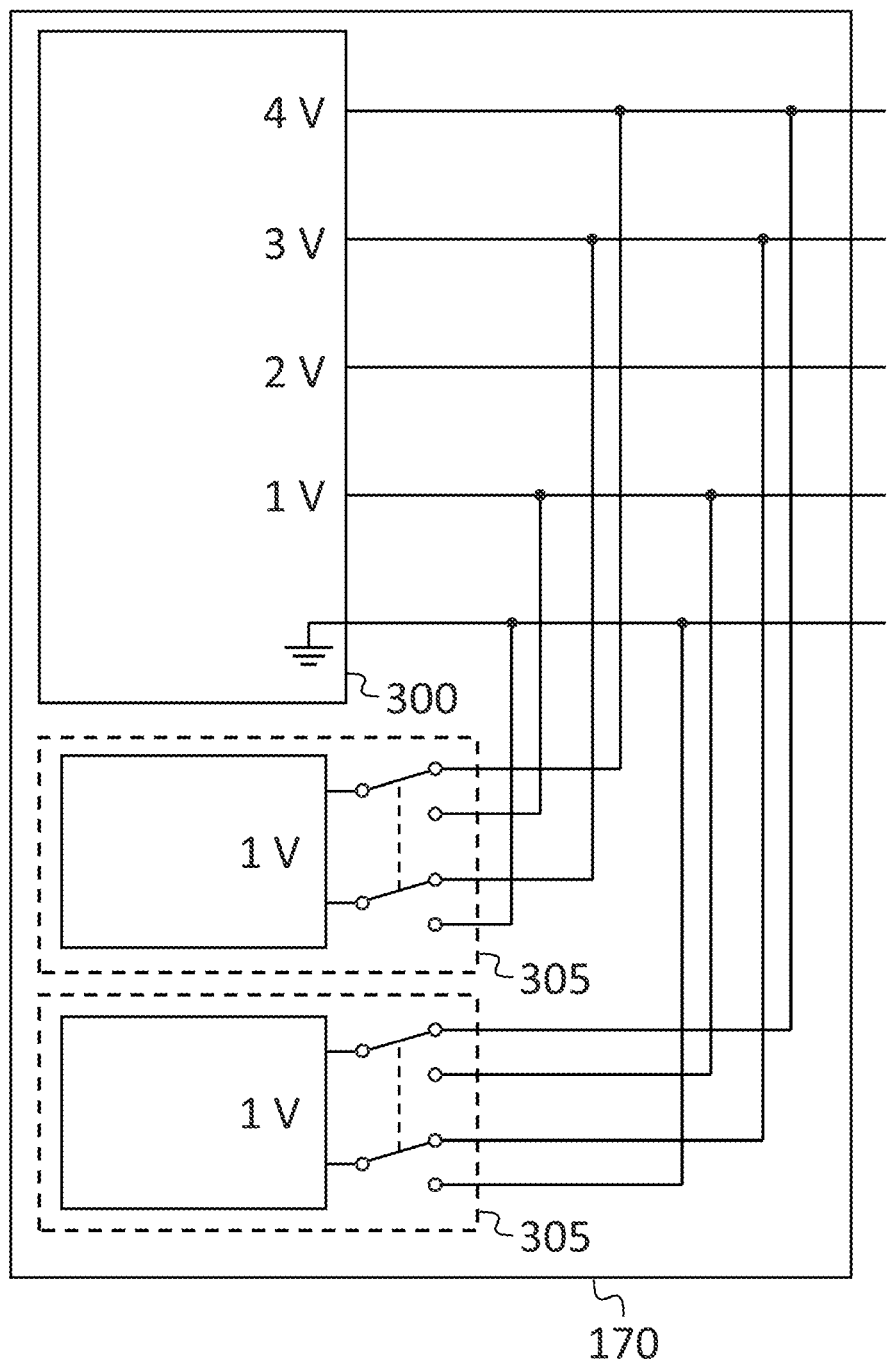
FIG. 3A is a block diagram of a DC to DC converter module, according to an embodiment of the present disclosure.

In other embodiments, such unused capacity may be reduced using a circuit such as that of FIG. 3A. In the circuit of FIG. 3A, the DC to DC converter module 170 includes first, "central" voltage generator 300, and two "movable" voltage generators 305 (referred to as "movable" because, as discussed in further detail below, each may be connected to either a first pair of rails of the central voltage generator 300 or to a second pair of rails of the central voltage generator 300). Each of the voltage generators 300, 305 may have (i) a plurality of input terminals for receiving power, e.g., from the batteries, and (ii) a plurality of output terminals (the rails); the input terminals may be isolated from the output terminals and are not shown.

Figure 3B:
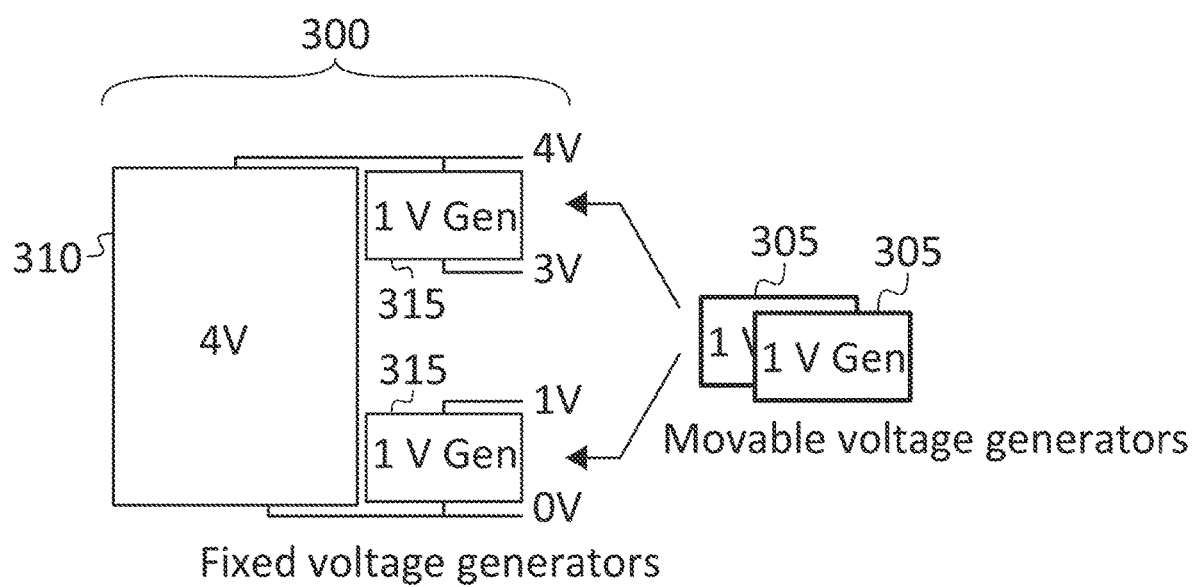
FIG. 3B is a block diagram of a DC to DC converter module, according to an embodiment of the present disclosure.

The central voltage generator 300 has five output terminals, respectively connected to five power supply rails, one each at 0 V, 1 V, 2 V, 3 V, and 4 V. The central voltage generator 300 may include one or more voltage generators (e.g., as illustrated in FIG. 3B), including a voltage generator connected to the 0 V and 1 V rails, and a voltage generator connected to the 3 V and 4 V rails. Each of the movable voltage generators 305 generates 1 V and includes a double-pole double-throw (DPDT) switch through which it may be connected to either (i) the 0 V and 1 V rails of the central voltage generator 300, or (ii) the 3 V and 4 V rails of the central voltage generator 300. If each of the movable voltage generators 305 has a capacity of 100 µW, and if the central voltage generator 300 has a capacity of 100 µW for (i) power drawn from the 0 V and 1 V rails and for (ii) power drawn from the 3 V and 4 V rails, then the power requirements of the three modes of FIG. 2D may be met by the circuit of FIG. 3A. This may be accomplished by (i) in the first mode, connecting both of the movable voltage generators 305 to the 3 V and 4 V rails, (ii) in the second mode, connecting both of the movable voltage generators 305 to the 0 V and 1 V rails, and (iii) in the third mode, connecting one of the movable voltage generators 305 to the 0 V and 1 V rails, and connecting the other movable voltage generator 305 to the 3 V and 4 V rails.

FIG. 3B shows a circuit in which the central voltage generator 300 includes a 4 V voltage generator 310 and two 1 V voltage generators 315 in a "fixed" configuration (i.e., hard wired together, unlike the movable voltage generators 305). Each of the two 1 V fixed voltage generators 315 may be identical to the voltage generators included (along with a DPDT switch) in each of the movable voltage generators 305. Each of the movable voltage generators 305 may be either (i) connected in parallel with the lower 1 V fixed voltage generator 315 (i.e., connected to the 0 V and 1 V rails) or (ii) connected in parallel with the upper 1 V fixed voltage generator 315 (i.e., connected to the 3 V and 4 V rails). For ease of illustration, the DPDT switches of the movable voltage generators 305 are not explicitly shown.

FIGS. 3C, 3D, and 3E show the configurations of the two 1 V fixed voltage generators 315 and the two movable voltage generators 305 that may be used in the first, second, and third mode, respectively. In each of FIGS. 3C-3E, each of the movable voltage generators 305 is shown, drawn with a heavier outline, behind the 1 V fixed voltage generator 315 with which it is connected in parallel. FIG. 3F shows a configuration without any movable voltage generators 305, illustrating that a total of six 1 V fixed voltage generators 315 may be needed to meet the requirements of the power-consuming circuits if none of the voltage generators are movable. The chip area occupied by a voltage generator circuit may scale approximately as the power the voltage generator circuit is capable of supplying, and, as such, the use of movable voltage generators 305 may reduce the chip area occupied by circuits for generating power at 1 V by one third, in a system with the power requirements of FIG. 2D. In some embodiments, a more generally reconfigurable power supply may be constructed using additional movable voltage generators 305 or additional switches, which may make it possible to configure a variety of series, parallel, or series-parallel combinations of movable and fixed voltage generators.

Figure 3G:
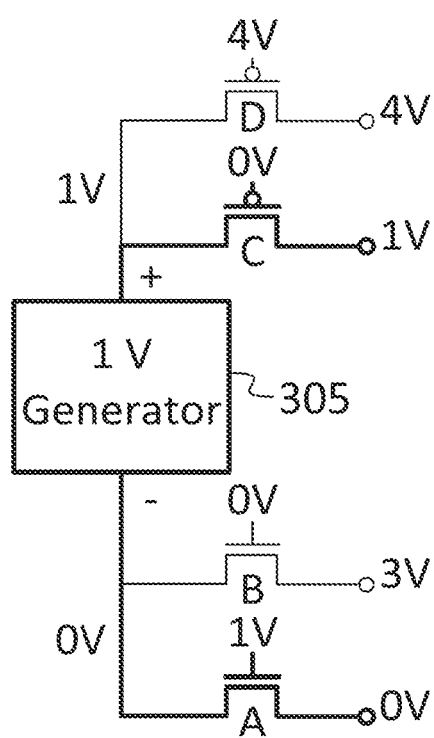
FIG. 3G is a schematic diagram of a movable voltage generator, according to an embodiment of the present disclosure.
Figure 3H:
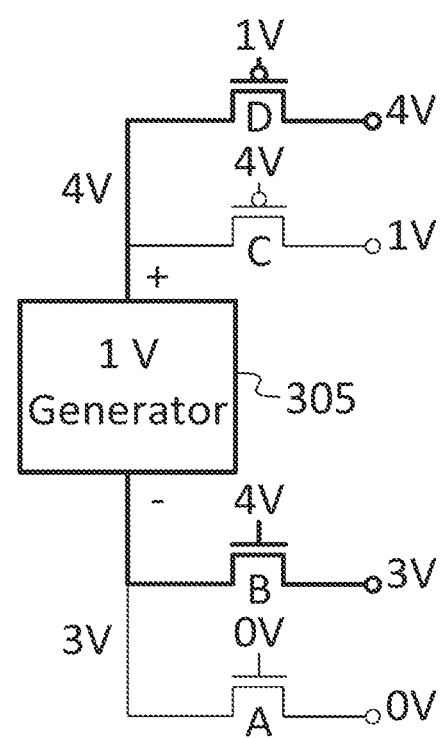
FIG. 3H is a schematic diagram of a movable voltage generator, according to an embodiment of the present disclosure.

FIGS. 3G and 3H show one of the movable voltage generators 305 connected to the 0 V, 1 V, 3 V, and 4 V rails by four (single-pole single-throw) transistor switches, which are configured to operate as the corresponding DPDT switch of FIG. 3A. A lower pair of switches controls the connection of the negative output terminal of the movable voltage generator 305, with a first switch (transistor A) and a second switch (transistor B) being connected to the 0 V rail and the 3 V rail, respectively. An upper pair of switches controls the connection of the positive output terminal of the movable voltage generator 305, with a third switch (transistor C) and a fourth switch (transistor D) being connected to the 1 V rail and the 4 V rail, respectively. Transistors C and D may be p-channel metal oxide semiconductor (PMOS) transistors, as indicated by circles on the gates of their respective circuit symbols, and transistors A and B may be n-channel metal oxide semiconductor (NMOS) transistors (as indicated by the absence of such circles). Each transistor may be controlled by a control voltage applied to the gate; each control voltage may be 0 V, 1 V, or 4 V, as shown (with, e.g., 0 V and 1 V being generated by control logic, and 4 V being generated by one or more level shifters). In each of FIGS. 3G and 3H (and in FIGS. 3I-3L and 4D-4G, discussed below), heavy lines show current paths through transistors that are turned on, and lighter lines showing paths that are blocked because they pass through transistors that are turned off. FIG. 3G shows the circuit in a first state, in which the movable voltage generator 305 is connected to the 0 V and 1 V rails, and FIG. 3H shows the circuit in a second state, in which the movable voltage generator 305 is connected to the 3 V and 4 V rails. In the first state (FIG. 3G), the applied gate voltages cause transistors A and C to be turned on (and transistors B and D to be turned off) so that the movable voltage generator 305 is connected to the 0 V and 1 V rails. In the second state (FIG. 3H), the applied gate voltages cause transistors B and D to be turned on (and transistors A and C to be turned off) so that the movable voltage generator 305 is connected to the 3 V and 4 V rails.

Figure 3I:
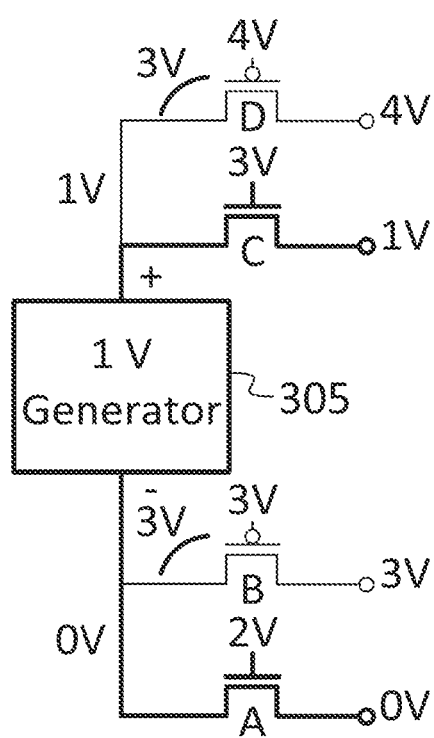
FIG. 3I is a schematic diagram of a movable voltage generator, according to an embodiment of the present disclosure.
Figure 3J:
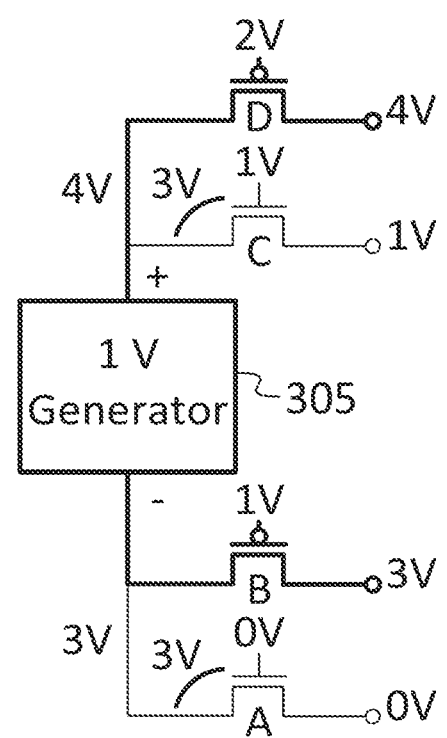
FIG. 3J is a schematic diagram of a movable voltage generator, according to an embodiment of the present disclosure.

In the circuit of FIGS. 3G and 3H, the gate voltage of transistor C, and of transistor B, may change from 0 V in the first state to 4 V in the second state, and drive transistors in a drive circuit employed to drive the gate of transistor C, or of transistor B, may be exposed, in the first state or in the second state, to a gate-source voltage of 4 V, which may be sufficiently great to damage the drive transistors (e.g., to damage the gate oxide of the drive transistors). As used herein, the "gate-channel voltage" is the maximum of (i) the magnitude of the gate-source voltage and (ii) the magnitude of the gate-drain voltage, and, as such, is a measure of the maximum electric field applied to the gate oxide. FIGS. 3I and 3J illustrate an embodiment in which the greatest gate-channel voltage applied to any transistor is 3 V, and the maximum change in any gate voltage, in transitioning between the first state and the second state, is 2 V. This is accomplished by (i) replacing transistor B with a PMOS transistor, (ii) replacing transistor C with an NMOS transistor, and (iii) using control voltages of 2 V and 3 V, in addition to the 0 V, 1 V, and 4 V control voltages employed in the embodiment of FIGS. 3G and 3H.

Figure 3K:
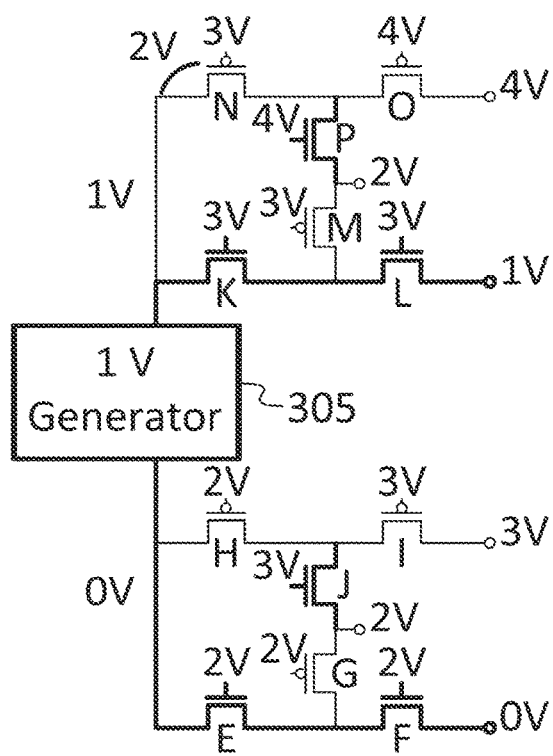
FIG. 3K is a schematic diagram of a movable voltage generator, according to an embodiment of the present disclosure.
Figure 3L:
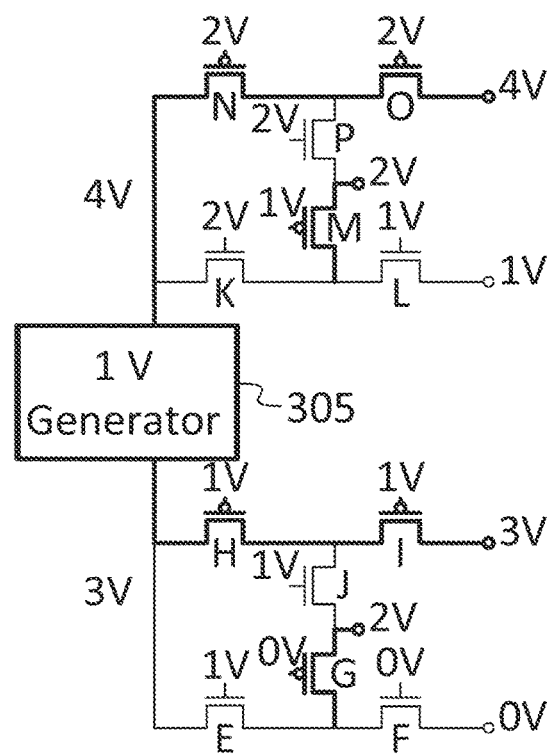
FIG. 3L is a block diagram of a movable voltage generator, according to an embodiment of the present disclosure.

Some integrated circuit technologies may use transistors, however, that may be damaged by a gate-channel voltage of 3 V. FIGS. 3K and 3L show an embodiment, in the first state and in the second state, respectively, in which the greatest gate-channel voltage applied to any transistor in either state is 2 V. In this embodiment, each of the switching transistors of the embodiment of FIGS. 3G and 3H is replaced by a composite three-transistor switch. For example, transistor A of the embodiment of FIGS. 3G and 3H is replaced by (i) a first series transistor (transistor E), and a second series transistor (transistor F), connected together at a first common node 320, and (ii) a voltage setting transistor (transistor G), connected to the common node. When the composite switch is in the on state (i.e., the two series transistors are turned on), the voltage setting transistor is turned off. When the composite switch is in the off state (i.e., the two series transistors are turned off) the voltage setting transistor supplies, to the common node 320, a voltage that is intermediate to the voltages at the ends of the series combination (2 V, for each of the four composite switches in FIGS. 3K and 3L), thereby preventing the common node 320 from floating to a voltage that results in either of the two series transistors (i) turning on, or (ii) being damaged by an excessive gate-channel voltage.

In the first state, a gate voltage of 2 V is applied to each of the series transistors E and F, and both are on, connecting the negative output terminal of the movable voltage generator 305 to the 0 V rail; a gate voltage of 2 V is applied to the voltage setting transistor G and it is off. In this state, each of the gate-channel voltages is 2 V. In the second state, (i) a gate voltage of 0 V is applied to the series transistor F, and to the voltage setting transistor G, turning them off and on respectively, and pulling the common node 320 up to 2 V, (ii) series transistors H and I (in the second composite switch, corresponding to the second switch of FIGS. 3G and 3H) are turned on, pulling the negative output terminal of the movable voltage generator 305 up to 3 V, and (iii) series transistor E, the gate voltage of which remains at 2 V, is turned off, because of the increase in the voltage on the common node 320 and on the negative output terminal of the movable voltage generator 305. In the second state, the gate-channel voltage of each of transistors F and G is 2 V, and the gate-channel voltage of transistor E is 1 V.

The second, third, and fourth composite switches in FIGS. 3K and 3L (which replace transistor B, C, and D, respectively, in the embodiment of FIGS. 3G and 3H) consist of (i) series transistors H and I, and voltage setting transistor J, (ii) series transistors K and L, and voltage setting transistor M, and (iii) series transistors N and 0, and voltage setting transistor P, respectively.

Gate voltages that are applied in the first state and in the second state are shown in FIGS. 3K and 3L, respectively. In some embodiments, different gate voltages are employed with substantially the same effect. For example, the voltage sources to which the voltage setting transistors of the third and fourth composite switches are connected may be at 3 V instead of 2 V, and the gate voltage of transistor K may remain at 3 V in the second state. In the embodiment of FIGS. 3K and 3L, each of the composite switches blocks (i.e., has applied across it), in the off state, a voltage of 3 V, but the greatest gate-channel voltage is 2 V. In some embodiments, a longer chain of series transistors may be used instead of two series transistors, in a composite switch (with an additional voltage setting transistor connected to each additional common node), to enable the composite switch (i) to block a larger voltage in the off state, without applying a gate-channel voltage exceeding 2 V, or (ii) to block 3 V while applying a maximum gate-channel voltage of less than 2 V, or both.

When the series transistors transition from the on state to the off state, it may be advantageous to ensure that the transistors switch substantially simultaneously, or that, to the extent the switching is not simultaneous, the currents and voltages during the switching transient do not damage any of the transistors. For example, if the voltage setting transistor G is turned on before the two series transistors E and F are turned off, then relatively high currents may flow through the three transistors. These high currents may, if they persist long enough, damage the transistors by heating or deplete the battery. As such, it may be advantageous, when transitioning between the states, to (i) turn off the two voltage setting transistors that are on, then to (ii) set the gate voltages of all of the series transistors to their new values, and then to (iii) turn on the other two voltage setting transistors. If this sequence is followed, series transistor F, for example, may be turned off when its gate voltage changes to 0 V, and series transistor E may be turned off when the voltage on its left terminal increases to 3 V. Even though the voltage setting transistor G may not be turned on immediately, an increase in the voltage of the common node 320 beyond 2 V (which would result in a gate-channel voltage exceeding 2 V at series transistor F) may be avoided by the turning off of series transistor E.

In some circumstances, communications between the circuits of the electronic contact lens 100 may involve communications between circuits operating at different voltages. For example, a control circuit, such as the monitoring and control circuit 175 of the power management unit 155, may use power supply voltages of 0 V and 1 V, and logic levels defined accordingly. Moreover, each of the movable voltage generators 305 may include a power supply control circuit, which may (i) use logic levels defined according to the rails to which the movable voltage generator 305 is connected, and which may (ii) receive commands from, and send status information to, the monitoring and control circuit 175. For example, when the movable voltage generator 305 is connected to the 0 V and 1 V rails, the movable voltage generator 305 may define a low level to be at or near 0 V, and a high level to be at or near 1 V, and when the movable voltage generator 305 is connected to the 3 V and 4 V rails, the movable voltage generator 305 may define a low level to be at or near 3 V, and a high level to be at or near 4 V.

Figures 4A, 4B:
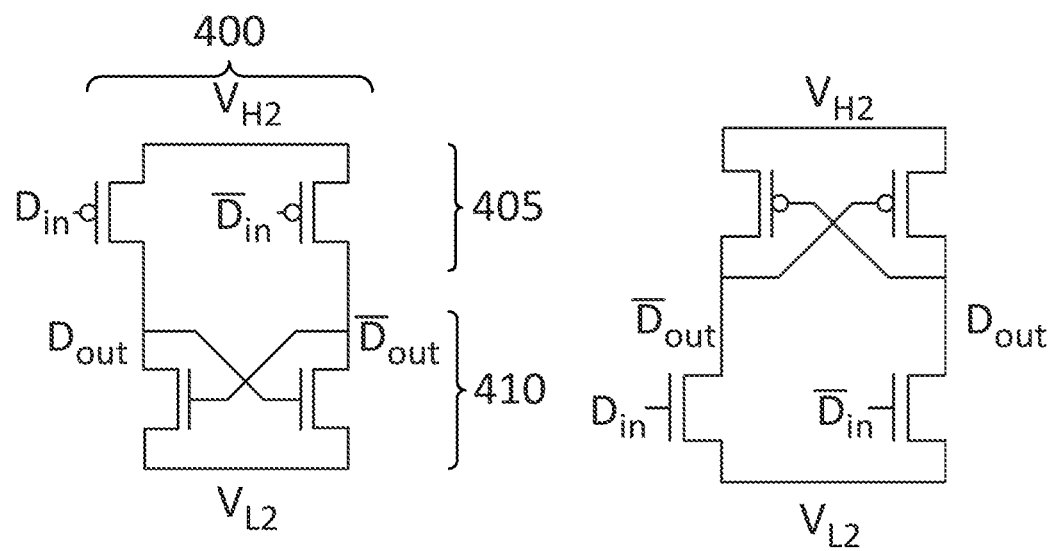
FIG. 4A is a schematic diagram of a level shifter, according to an embodiment of the present disclosure.
FIG. 4B is a schematic diagram of a level shifter, according to an embodiment of the present disclosure.
Figure 4C:
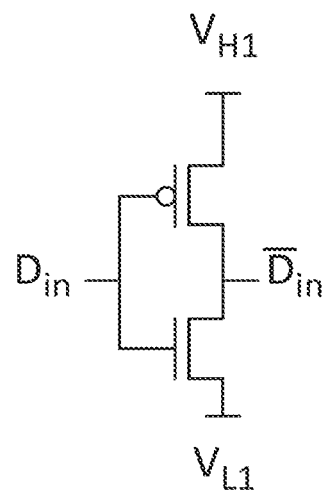
FIG. 4C is a schematic diagram of an inverter, according to an embodiment of the present disclosure.

A level shifter may be used to enable communications in such a case, e.g., between the monitoring and control circuit 175 and the movable voltage generator 305. FIGS. 4A and 4B show examples of differential level shifter circuits. In the circuit of FIG. 4A, the level shifter 400 includes a pair of PMOS input transistors 405 and a cross-coupled pair of NMOS transistors 410. In operation, the cross-coupled pair of NMOS transistors 410 operates as an amplifier with positive feedback that amplifies the difference between the gate voltages of the input transistors 405 and, depending on whether the input voltage Din is less than or greater than its complement (labeled Din with an overbar in FIG. 4A), either (i) drives Dout to the lower supply voltage $V_{L2}$ and drives its complement (labeled Dout with an overbar in FIG. 4A) to the upper supply voltage $V_{H2}$, or (ii) drives Dout to the upper supply voltage $V_{L2}$ and drives its complement to the lower supply voltage $V_{L2}$. The circuit of FIG. 4A may be suitable for shifting the level of an input signal that ranges between a low voltage Vu and a high voltage $V_{H1}$, with the upper supply voltage being within the input signal range (i.e., $V_{L1} < V_{H2} < V_{H1}$). FIG. 4B is a differential level shifter that is the dual of the circuit of FIG. 4A, and that may be used if $V_{L1} < V_{L2} < V_{H1}$. FIG. 4C is a schematic diagram of an inverter that may be used to create a differential signal from a single-ended signal, if the circuit connected to the input of the level shifter does not provide a differential signal. If a level shifter includes an inverter, the second stage of the level shifter (which may be the circuit of FIG. 4A or the circuit of FIG. 4B) may be referred to as the "shifting stage" of the level shifter.

Figure 4D:
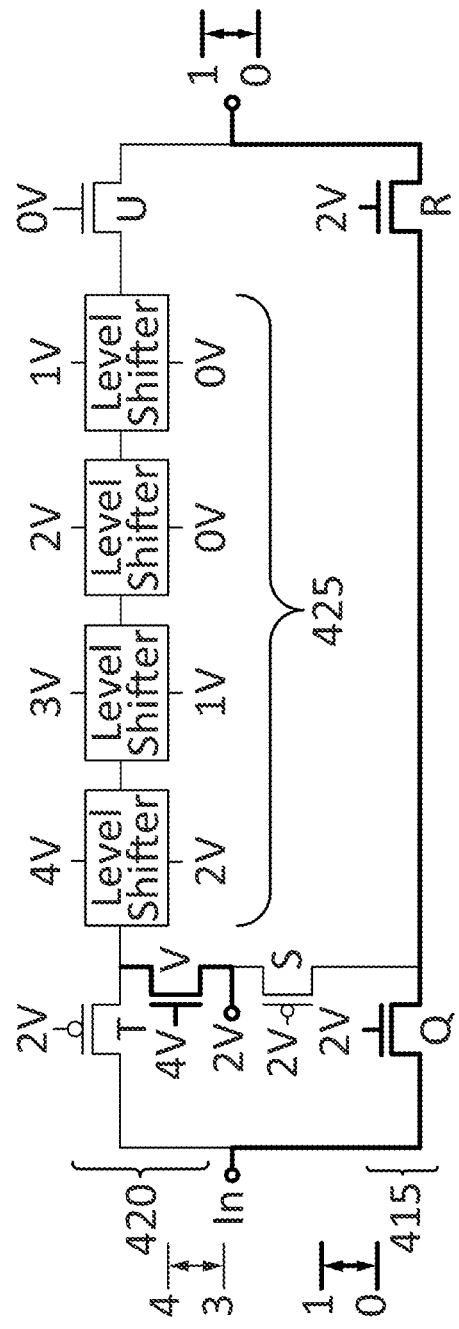
FIG. 4D is a schematic diagram of a configurable interface circuit, according to an embodiment of the present disclosure.
Figure 4E:
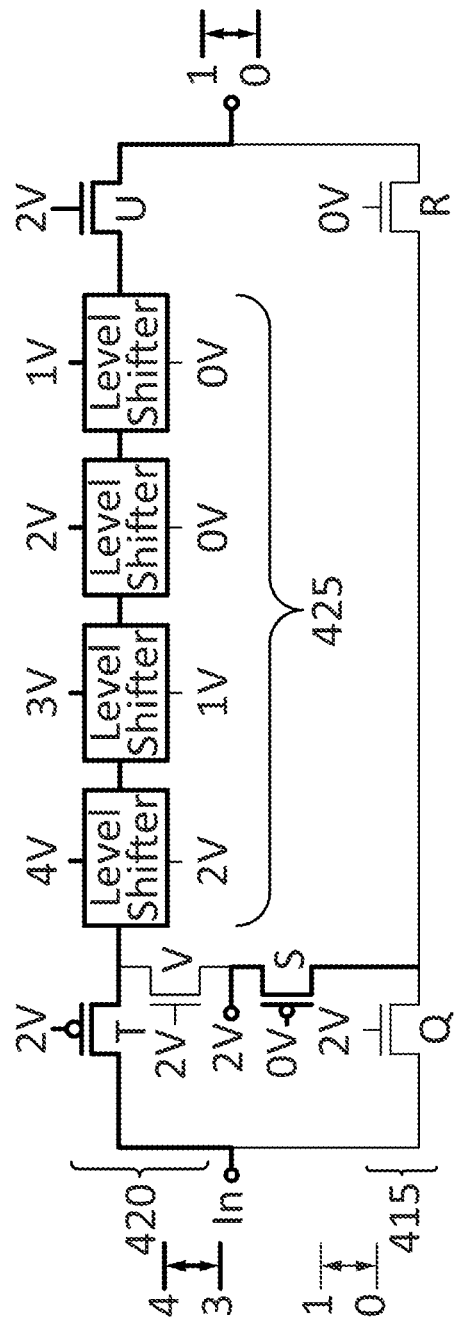
FIG. 4E is a schematic diagram of a configurable interface circuit, according to an embodiment of the present disclosure.

FIGS. 4D and 4E show a configurable interface circuit that may be used, for example, for the sending of status information from one of the movable voltage generators 305 (e.g., from a data output terminal of the movable voltage generator 305) to the monitoring and control circuit 175 (e.g., to a data input terminal of the monitoring and control circuit 175) (which may operate between 0 V and 1 V rails). The interface circuit operates in two states, operating in a first state and in a second state when the movable voltage generator 305 is connected to the 0 V and 1 V rails and to the 3 V and 4 V rails, respectively. In the first state the signal propagates through a lower signal path 415, including two series transistors, and in the second state, the signal propagates through an upper signal path 420, including two series transistors and a chain of level shifters 425. The first state is illustrated in FIG. 4D and the second in FIG. 4E.

In the second state (illustrated in FIG. 4E), the signal propagates from the input through a first series transistor T, through the chain of level shifters 425 and through a second transistor T, to the output. In some embodiments the first level shifter of the chain of level shifters 425 includes an inverter (e.g., the inverter of FIG. 4C) for converting the single-ended input signal it receives to a differential signal, and each of the remaining level shifters in the chain of level shifters 425 does not include an inverter and receives a differential signal from the level shifter that precedes it. The voltage rails with which each level shifter is labeled indicate the voltage rails to which the level shifter is connected (if it includes only one stage) or the voltage rails the shifting stage is connected to if the level shifter includes both an inverter and a shifting stage.

In operation, in a manner analogous to that of the circuit of FIGS. 3K and 3L, the use of two series transistors and voltage setting transistors in each signal path 415, 420 results in a smaller maximum gate-channel voltage than would be present in an otherwise similar circuit using single-transistor switches. For example, in the circuit of FIGS. 4D and 4E, the lower signal path 415 includes a composite switch analogous to the first composite switch of FIGS. 3K and 3L, with a first series transistor Q, a second series transistor R, and a voltage setting transistor S. This switch is capable of blocking a voltage of 3 V without applying a gate-channel voltage exceeding 2 V to any of the three transistors of the composite switch. Gate voltages that may be used in the first and second states are shown in FIGS. 4D and 4E, respectively. The maximum gate-channel voltage in the lower path is 2 V in the first state (on each of the transistors, when the signal is low, i.e., 0 V), and 2 V in the second state (on transistor Q, when the signal is 4 V). The maximum gate-channel voltage in the upper path is 2 V in the first state (on the voltage setting transistor V, and on the first series transistor T, when the signal is low (i.e., 0 V)), and 2 V in the second state (on the first series transistor T, when the signal is high (i.e., 4 V)). In some embodiments, different gate voltages are used to achieve substantially the same behavior (e.g., in the first state the gate voltage of transistor V may be 3 V instead of 4 V). As in the embodiment of FIGS. 3K and 3L, the voltage setting transistors S and V avoid voltages, at the nodes to which they are connected, that otherwise could cause damage to, or the unintended turning on of, one or more of the series transistors Q, R, T and U.

Figure 4F:
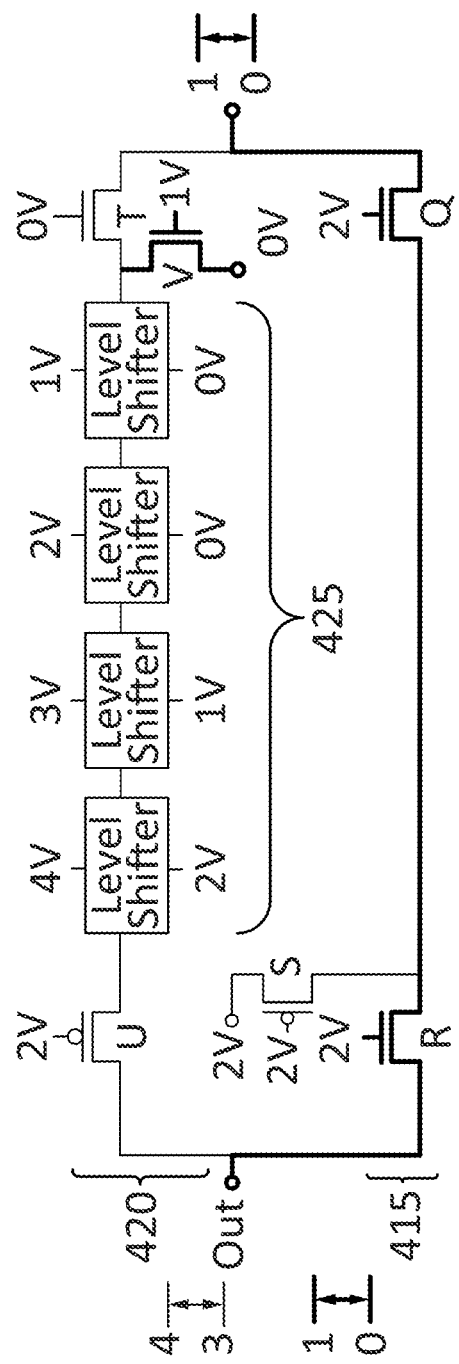
FIG. 4F is a schematic diagram of a configurable interface circuit, according to an embodiment of the present disclosure.
Figure 4G:
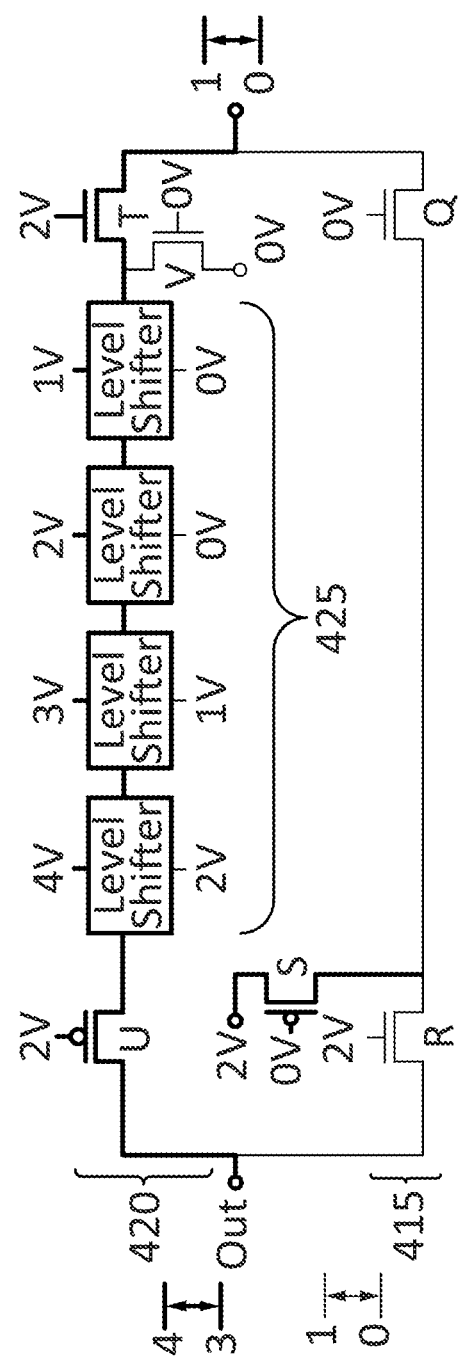
FIG. 4G is a schematic diagram of a configurable interface circuit, according to an embodiment of the present disclosure.

FIGS. 4F and 4G show a configurable interface circuit that may be used, for example, for the sending of commands from the monitoring and control circuit 175 to one of the movable voltage generators 305. In FIGS. 4F and 4G, the input of the configurable interface circuit is at the right end of the chain, and the output is at the left end. Gate voltages that may be used in the first and second states are shown in FIGS. 4D and 4E, respectively. In the first state (FIG. 4F), the output of the last level shifter of the chain of level shifters 425 may be pulled low (to avoid turning on of series transistor U), e.g., (i) by pulling the input of the first level shifter of the chain of level shifters 425 low, using voltage setting transistor V, or (ii) by a circuit internal to the last level shifter of the chain of level shifters 425 (in which case transistor V may be absent). In some embodiments, different gate voltages are used to achieve substantially the same behavior (e.g., (i) in the first state the gate voltage of transistor V may be 2 V instead of 1 V, or (ii) in the second state the gate voltage of transistor Q may be less than 2 V, e.g., it may be 0 V, in which case the gates of transistors Q and R may be connected together).

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, the word "or" is inclusive, so that, for example, "A or B" means any one of (i) A, (ii) B, and (iii) A and B.

It will be understood that when an element is referred to as being "directly connected" or "directly coupled" to another element, there are no intervening elements present. As used herein, "generally connected" means connected by an electrical path that may contain arbitrary intervening elements, including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively affect the behavior of the circuit.

Unless the context indicates otherwise (e.g., in the phrase "an SPDT switch"), a "switch" is a two-terminal device configured to operate in two states, an "open" state, in which the impedance between the two terminals is high, and a "closed" state in which the impedance between the two terminals is low. As such, a transistor switch that is turned on (or simply "on") may be said to be "closed" and a transistor switch that is turned off (or simply "off") may be said to be "open". When two transistors are connected such that, when both transistors are turned on, current will flow through them in series, the node at which the transistors are connected together may be referred to as the "common node" and the transistors may be said to be "connected in series", and the two ends of the channels that are not at the common node are the "ends" of the series combination.

Some examples are presented in the present disclosure based on NMOS and PMOS transistors in a CMOS circuit; in some embodiments, other switches, e.g., bipolar transistors, may be employed in an analogous manner. A "transistor" as used herein is an element with two power terminals (e.g., the source and drain, or the emitter and collector) and a control terminal (e.g., the gate or the base). When the connections of a transistor are described as though the transistor were a two-terminal device (e.g., "two transistors connected in series") the connections described are connections to the power terminals (e.g., the source and the drain, or the emitter and the collector).

Although exemplary embodiments of a power supply with a movable generator have been specifically described and illustrated herein, many modifications and variations will be apparent to those skilled in the art. Accordingly, it is to be understood that a power supply with a movable generator constructed according to principles of this disclosure may be embodied other than as specifically described herein. The invention is also defined in the following claims, and equivalents thereof.

What is claimed is:

1. An electronic contact lens comprising:
   a plurality of power-consuming circuits in the electronic contact lens; and
   a power supply circuit in the electronic contact lens, the power supply circuit comprising:
a first voltage generator circuit;
a second voltage generator circuit;
a third voltage generator circuit; and
a first switching circuit,
the first switching circuit being configured:
in a first state, to cause the third voltage generator circuit to be connected in parallel with the first voltage generator circuit, and
in a second state, to cause the third voltage generator circuit to be connected in parallel with the second voltage generator circuit.

2. The electronic contact lens of claim 1, wherein:
the first voltage generator circuit has a first output and a second output;
the second voltage generator circuit has a first output and a second output;
the third voltage generator circuit has a first output and a second output;
the first switching circuit comprises:
a first switch, connected between the first output of the third voltage generator circuit and the first output of the first voltage generator circuit,
a second switch, connected between the first output of the third voltage generator circuit and the first output of the second voltage generator circuit,
a third switch, connected between the second output of the third voltage generator circuit and the second output of the first voltage generator circuit, and
a fourth switch, connected between the second output of the third voltage generator circuit and the second output of the second voltage generator circuit;
in the first state:
the first switch is closed,
the third switch is closed,
the second switch is open, and
the fourth switch is open; and
in the second state,
the first switch is open,
the third switch is open,
the second switch is closed, and
the fourth switch is closed.

3. The electronic contact lens of claim 2, further comprising a fourth voltage generator circuit having a first output and a second output, wherein:
the first output of the fourth voltage generator circuit is connected to:
the first output of the first voltage generator circuit, or
the second output of the first voltage generator circuit; and
the second output of the fourth voltage generator circuit is connected to:
the first output of the second voltage generator circuit, or
the second output of the second voltage generator circuit.

4. The electronic contact lens of claim 3, wherein the fourth voltage generator circuit is a composite voltage generator circuit comprising two voltage generator circuits connected in series.

5. The electronic contact lens of claim 2, wherein the first switch comprises:
a first transistor and a second transistor connected in series at a common node, and
a third transistor, connected between a voltage source and the common node, wherein in the second state:
the first transistor is turned off,
the second transistor is turned off, and
the third transistor is turned on.

6. The electronic contact lens of claim 5, wherein, in the second state, the voltage of the common node is intermediate to the voltages at the ends of the series combination of the first transistor and the second transistor.

7. The electronic contact lens of claim 2, wherein:
the first output of the first voltage generator circuit is at a first voltage relative to the first output of the second voltage generator circuit;
the first switching circuit comprises a plurality of transistors; and
the first switching circuit is configured to transition between the first state and the second state without the gate-channel voltage of any of the transistors exceeding a second voltage, the second voltage being less than the first voltage.

8. The electronic contact lens of claim 1, further comprising:
a control circuit; and
a second switching circuit,
the second switching circuit being configured:
in the first state, to cause a data input terminal of the control circuit to be connected to a data output terminal of the third voltage generator circuit through a first chain of zero or more level shifters; and
in the second state, to cause the data input terminal of the control circuit to be connected to the data output terminal of the third voltage generator circuit through a second chain of zero or more level shifters.

9. The electronic contact lens of claim 8, wherein the second switching circuit comprises:
a first switch, between the data output terminal of the third voltage generator circuit and a first terminal of the first chain of zero or more level shifters; and
a second switch, between the data output terminal of the third voltage generator circuit and a first terminal of the second chain of zero or more level shifters.

10. The electronic contact lens of claim 9, wherein the first switch comprises:
a first transistor, connected between the data output terminal of the third voltage generator circuit and the first terminal of the first chain of zero or more level shifters; and
a second transistor, connected between a voltage source and the first terminal of the first chain of zero or more level shifters.

11. The electronic contact lens of claim 1, wherein the power-consuming circuits include a display.

12. The electronic contact lens of claim 1, wherein the power-consuming circuits include a motion sensor.

13. The electronic contact lens of claim 1, wherein the power-consuming circuits include a microwave radio transceiver.

14. The electronic contact lens of claim 1, further comprising a battery configured to supply power to the power supply circuit.

15. The electronic contact lens of claim 1, further comprising a conductive coil, for receiving inductively coupled power.

* * * * *